US008642420B2

(12) United States Patent
Flachowsky et al.

(10) Patent No.: US 8,642,420 B2
(45) Date of Patent: Feb. 4, 2014

(54) FABRICATION OF A SEMICONDUCTOR DEVICE WITH EXTENDED EPITAXIAL SEMICONDUCTOR REGIONS

(75) Inventors: Stefan Flachowsky, Dresden (DE); Frank Wirbeleit, Dresden (DE); Matthias Kessler, Dresden (DE); Ricardo P. Mikalo, Heideblick (DE)

(73) Assignee: Globalfoundries, Inc., Grand Cayman (KY)

( * ) Notice: Subject to any disclaimer, the term of this patent is extended or adjusted under 35 U.S.C. 154(b) by 222 days.

(21) Appl. No.: 13/219,331

(22) Filed: Aug. 26, 2011

(65) Prior Publication Data
US 2013/0052779 A1 Feb. 28, 2013

(51) Int. Cl.
*H01L 21/8238* (2006.01)
(52) U.S. Cl.
USPC .................................. 438/229; 257/E21.634
(58) Field of Classification Search
USPC .......................................................... 438/229
See application file for complete search history.

(56) References Cited

U.S. PATENT DOCUMENTS

| 6,566,204 | B1 * | 5/2003 | Wang et al. | 438/286 |
| 7,078,285 | B1 * | 7/2006 | Suenaga | 438/199 |
| 2008/0242066 | A1 * | 10/2008 | Jacobson et al. | 438/525 |

OTHER PUBLICATIONS

Kastenmeir et al., "Highly selective etching of silicon nitride over silicon and silicon dioxide", J. Vac. Sci. Technol. A 17, 3179-3184 (1999).*

* cited by examiner

*Primary Examiner* — Leonard Chang
(74) *Attorney, Agent, or Firm* — Ingrassia Fisher & Lorenz, P.C.

(57) ABSTRACT

A method of fabricating a semiconductor device structure begins by forming a layer of oxide material overlying a first gate structure having a first silicon nitride cap and overlying a second gate structure having a second silicon nitride cap. The first gate structure corresponds to a p-type transistor to be fabricated, and the second gate structure corresponds to an n-type transistor to be fabricated. The method continues by performing a tilted ion implantation procedure to implant ions of an impurity species in a channel region of semiconductor material underlying the first gate structure, during which an ion implantation mask protects the second gate structure. Thereafter, the ion implantation mask and the layer of oxide material are removed, and regions of epitaxial semiconductor material are formed corresponding to source and drain regions for the first gate structure. Thereafter, the first silicon nitride cap and the second silicon nitride cap are removed.

19 Claims, 7 Drawing Sheets

FABRICATION OF A SEMICONDUCTOR DEVICE WITH EXTENDED EPITAXIAL SEMICONDUCTOR REGIONS

TECHNICAL FIELD

Embodiments of the subject matter described herein relate generally to semiconductor devices and related fabrication processes. More particularly, embodiments of the subject matter relate to the fabrication of a semiconductor device structure having extended height epitaxial semiconductor source and drain regions.

BACKGROUND

The prior art is replete with different techniques and processes for fabricating semiconductor devices such as metal oxide semiconductor field effect (MOSFET) transistors. In accordance with typical fabrication techniques, a MOS transistor is formed by creating a device structure on a semiconductor substrate, where the device structure includes a gate stack formed on a layer of semiconductor material, and source and drain regions formed in the semiconductor material to define a channel region under the gate stack. In addition, embedded strain elements (i.e., doped or undoped semiconductor material that imparts longitudinal stress on the channel region) can be used to improve the performance of MOS transistors.

In accordance with one proposed technique, epitaxial semiconductor material is overfilled to an extended height above the upper surface of the semiconductor material to enhance the stress-inducing benefits of the epitaxial semiconductor material. The geometry and extended height of the epitaxial semiconductor material may introduce challenges related to tilted ion implantation of the semiconductor material underlying the gate structures (e.g., halo and/or extension implants). For example, it may be necessary to perform tilted ion implantation before the creation of the epitaxial semiconductor regions.

BRIEF SUMMARY

A method of fabricating a semiconductor device structure is provided. The method begins by forming a first gate structure and a second gate structure overlying a semiconductor material, the first gate structure having a first silicon nitride cap overlying a first polysilicon gate element, and the second gate structure having a second silicon nitride cap overlying a second polysilicon gate element. The method continues by forming a layer of oxide material overlying the first gate structure and the second gate structure, resulting in a first covered gate structure and a second covered gate structure, forming an ion implantation mask overlying the second covered gate structure, while the first covered gate structure remains exposed, and subjecting the first covered gate structure to a tilted ion implantation procedure, while the ion implantation mask inhibits ion implantation at the second covered gate structure, resulting in an implanted device structure. Thereafter, the method prepares the implanted device structure for epitaxial material formation and forms regions of epitaxial semiconductor material corresponding to source and drain regions for the first gate structure.

Another exemplary embodiment of a method of fabricating a semiconductor device structure is also provided. The method involves forming a layer of oxide material overlying a first gate structure comprising a first silicon nitride cap and overlying a second gate structure comprising a second silicon nitride cap, the first gate structure corresponding to a first-conductivity-type transistor to be fabricated, and the second gate structure corresponding to a second-conductivity-type transistor to be fabricated. The method continues by performing a tilted ion implantation procedure to implant ions of an impurity species in a channel region of semiconductor material underlying the first gate structure, during which an ion implantation mask protects the second gate structure. After performing the tilted ion implantation procedure, the ion implantation mask and the layer of oxide material are removed. After removing the ion implantation mask and the layer of oxide material, the method forms regions of epitaxial semiconductor material corresponding to source and drain regions for the first gate structure. After forming the regions of epitaxial semiconductor material, the method removes the first silicon nitride cap and the second silicon nitride cap.

Also provided is a method of processing a semiconductor device structure comprising a semiconductor material, a first gate structure overlying the semiconductor material, and a second gate structure overlying the semiconductor material. The first gate structure includes a first silicon nitride cap, the second gate structure includes a second silicon nitride cap, the first gate structure corresponds to a p-type field effect transistor (PFET) to be fabricated, and the second gate structure corresponds to an n-type field effect transistor (NFET) to be fabricated. The method forms a layer of oxide material overlying the first gate structure and the second gate structure. After forming the layer of oxide material, the method performs a tilted ion implantation procedure to implant ions of an impurity species in the semiconductor material underlying the first gate structure, wherein an ion implantation mask covers the second gate structure during the tilted ion implantation procedure. After performing the tilted ion implantation procedure, the method removes the ion implantation mask and the layer of oxide material. After removing the ion implantation mask and the layer of oxide material, the method forms a layer of silicon nitride material overlying the first gate structure and the second gate structure. The method continues by creating spacers adjacent sidewalls of the first gate structure, the spacers created from the layer of silicon nitride material, etching source and drain cavities in the semiconductor material, using the spacers as a portion of an etch mask, and forming regions of epitaxial semiconductor material in the source and drain cavities, the regions of epitaxial semiconductor material extending above an upper surface of the semiconductor material.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
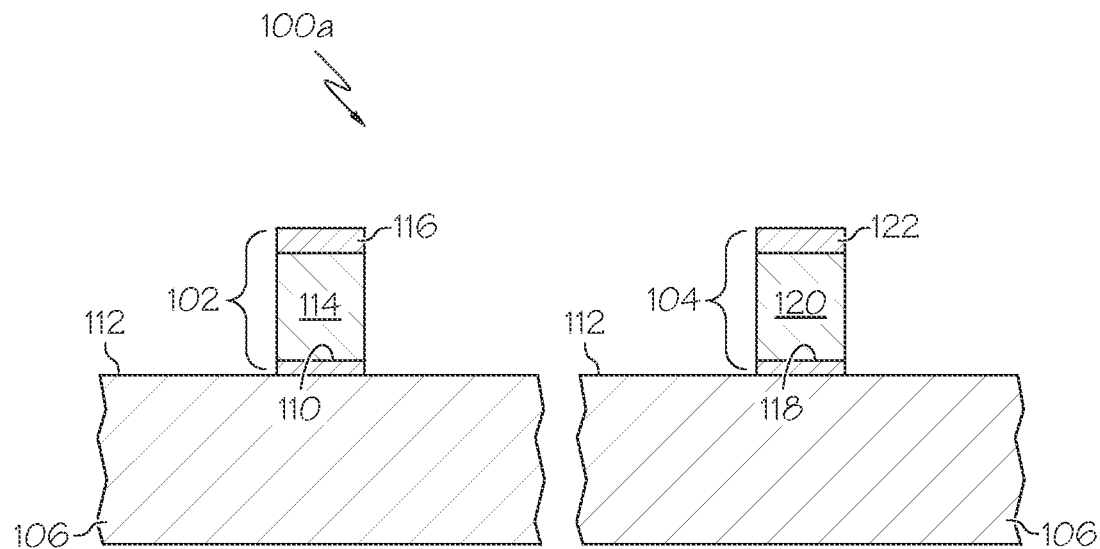
FIGS. 1-11 are cross sectional views that illustrate an exemplary semiconductor device structure and a method of fabricating it.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of a feature or element within a consistent but arbitrary frame of reference which is made clear by reference to the text and the associated drawings describing the item under discussion. Such terminology may include the words specifically mentioned above, derivatives thereof, and words of similar import. Similarly, the terms "first", "second", and other such numerical terms referring to structures do not imply a sequence or order unless clearly indicated by the context.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate MOS transistor devices, including NMOS transistor devices, PMOS transistor devices, and CMOS transistor devices. In particular, the process steps described here can be utilized in conjunction with any semiconductor device fabrication process that forms gate structures for transistors. Although the term "MOS device" properly refers to a device having a metal gate electrode and an oxide gate insulator, that term may be used to refer to any semiconductor device that includes a conductive gate electrode (whether metal or other conductive material) that is positioned over a gate insulator (whether oxide or other insulator) which, in turn, is positioned over a semiconductor substrate.

FIG. 1 depicts the fabrication state of a semiconductor device structure 100a after formation of gate structures 102, 104 overlying a layer of semiconductor material 106. FIG. 1 represents a view from a cross-section taken through the major longitudinal axes of the gate structures 102, 104. FIG. 1 depicts two sections of the semiconductor device structure 100a to indicate that the gate structures 102, 104 need not be (and typically will not be) immediately adjacent to one another. For this particular example, the gate structure 102 corresponds to one field effect transistor to be fabricated, and the gate structure 104 corresponds to another field effect transistor to be fabricated. More specifically, the gate structure 102 corresponds to a p-type field effect transistor (PFET) to be fabricated, and the gate structure 104 corresponds to an n-type filed effect transistor (NFET) to be fabricated. Although only two gate structures 102, 104 are shown in FIG. 1 (and the other figures), the semiconductor device structure 100a could include any number of gate structures intended for PFET devices, and any number of gate structures intended for NFET devices. The device structure 100a is formed using well known techniques and process steps (e.g., techniques and steps related to doping, photolithography and patterning, etching, material growth, material deposition, surface planarization, and the like) that will not be described in detail here.

The semiconductor material 106 is preferably a silicon material as typically used in the semiconductor industry, e.g., relatively pure silicon as well as silicon admixed with other elements such as germanium, carbon, and the like. Alternatively, the semiconductor material 106 can be germanium, gallium arsenide, or the like. The semiconductor material 106 can be either n-type or p-type, but is typically p-type, with wells of the appropriate type formed therein. The semiconductor material 106 may be provided as a bulk semiconductor substrate, or it could be provided on a silicon-on-insulator (SOI) substrate, which includes a support substrate, an insulator layer on the support substrate, and a layer of silicon material on the insulator layer.

For this particular example, the gate structure 102 includes, without limitation: a gate insulator 110 overlying the upper surface 112 of the semiconductor material 106; a gate element 114 overlying the gate insulator 110; and a hard mask cap 116 overlying the gate element 114. Similarly, the gate structure 104 includes, without limitation, a gate insulator 118, a gate element 120, and a hard mask cap 122. The hard mask caps 116, 122 are formed from a sacrificial material (such as a nitride, a silicide, or the like) that is used as part of an etch mask during the formation of the gate structures 102, 104. For the exemplary embodiment described here, the hard mask caps 116 are realized as silicon nitride caps.

The material used for the gate insulators 110, 118 can be a layer of thermally grown silicon dioxide or, alternatively, a deposited insulator such as a silicon oxide, silicon nitride, any kind of high-k oxide such as hafnium oxides, or the like. In preferred implementations, the gate insulators 110, 118 are formed from thermally grown oxide with nitrogen incorporated using an anneal. The gate oxide material can be deposited, for example, by chemical vapor deposition (CVD), atomic layer deposition (ALD), low pressure chemical vapor deposition (LPCVD), or plasma enhanced chemical vapor deposition (PECVD). The gate insulator material preferably has a thickness of about 1-10 nm, although the actual thickness can be determined based on the application of the transistor in the circuit being implemented.

The material for the gate elements 114, 120 is formed overlying the gate insulator material. In accordance with certain embodiments, the material used for the gate elements 114, 120 is polycrystalline silicon (also referred to as polysilicon), although other materials could be used instead of polysilicon. In other embodiments, the material used for the gate elements 114, 120 includes a thin metal layer underlying polysilicon. The layer of polysilicon is preferably deposited, e.g., using LPCVD by the hydrogen reduction of silane. Typically, the polysilicon will have a thickness within the range of about 50-100 nm. Thereafter, the polysilicon and the underlying gate insulator material are etched using the hard mask caps 116, 122 as an appropriate etch mask to arrive at the semiconductor device structure 100a depicted in FIG. 1.

Figure 2:
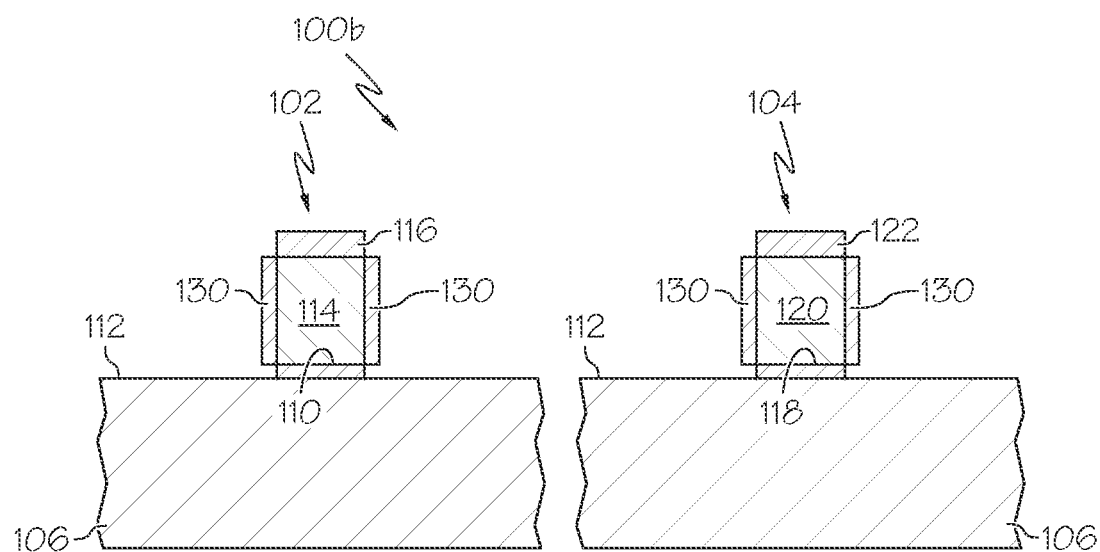

After formation of the gate structures 102, 104, the manufacturing process continues by forming oxide sidewalls 130 on the gate elements 114, 120. Creation of the oxide sidewalls 130 results in the semiconductor device structure 100b depicted in FIG. 2. The oxide sidewalls 130 may be formed by a conventional reoxidation technique such that oxide material forms at the exposed sides of the polysilicon gate elements 114, 120. In a typical implementation, the oxide sidewalls 130 are formed to a thickness of approximately three to five nanometers.

Figure 3:
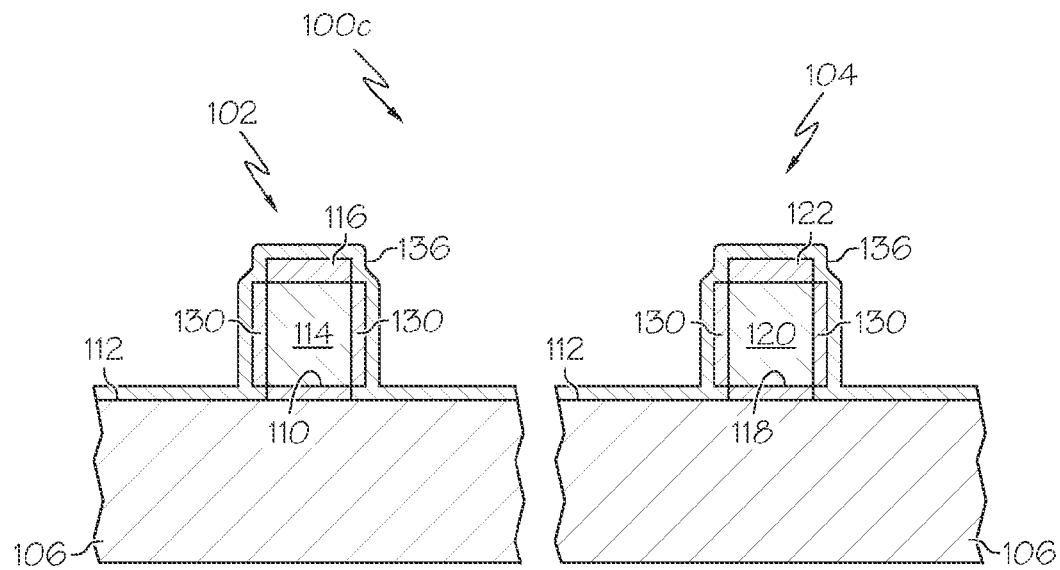

After formation of the oxide sidewalls 130, the fabrication process continues by forming a layer of oxide material 136 overlying the gate structures 102, 104, and overlying the oxide sidewalls 130, resulting in the semiconductor device structure 100c shown in FIG. 3. In certain embodiments, the layer of oxide material 136 is conformally deposited overlying the entire exposed surface of the semiconductor device structure 100b (see FIG. 2) such that it covers the gate structures 102, 104. In practice, the layer of oxide material 136 is deposited to a thickness less than 10 nm and, in preferred embodiments, to a thickness less than about 5 nm. The oxide material 136 may be, for example, a deposited silicon oxide material. The oxide material 136 could be deposited using any known technique, including any of the deposition techniques mentioned above.

Figure 4:
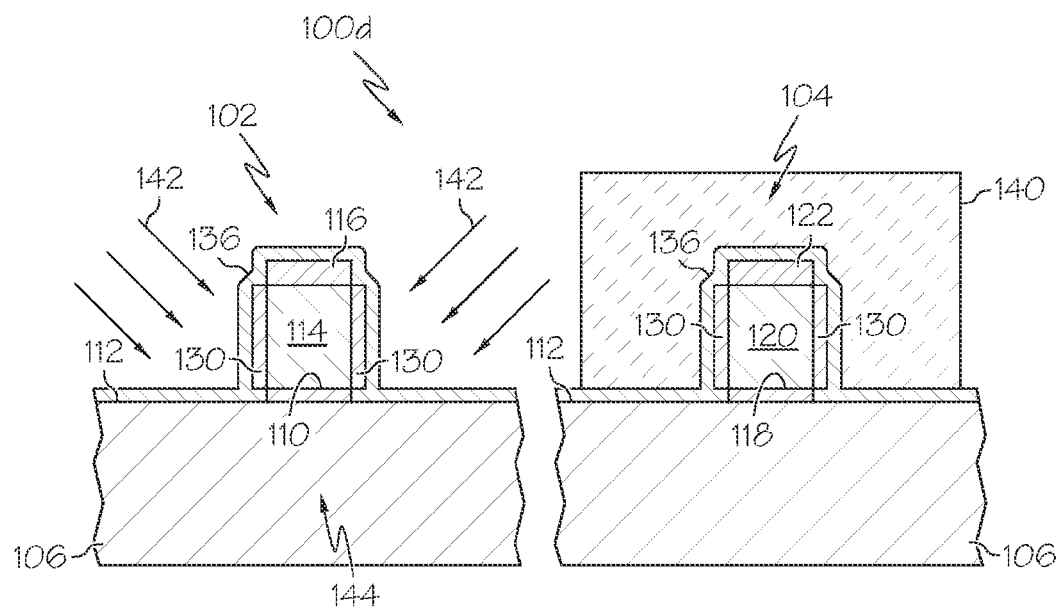

After formation of the layer of oxide material 136, the process continues by forming a patterned mask 140 that covers a selected portion of the semiconductor device structure 100 (resulting in the semiconductor device structure 100d shown in FIG. 4). For this example, the mask 140 overlies and protects the NFET areas of the semiconductor device structure 100d and leaves the PFET areas of the semiconductor device structure 100d exposed. The patterned mask 140 may be formed from an appropriate photoresist material that has been treated in a conventional manner using well-known photolithography techniques. For example, the patterned mask 140 can be created by depositing a layer of photoresist material over the exposed features of the device structure 100c (see FIG. 3), exposing the photoresist material using a photomask having an appropriate pattern defined therein, and developing the exposed photoresist material to selectively remove portions of the photoresist material.

After the mask 140 has been created, it may be used as an ion implantation mask during an appropriate tilted ion implantation procedure, which is also depicted in FIG. 4. As schematically illustrated in FIG. 4, the exposed area of the semiconductor device structure 100d near the gate structure 102 is bombarded by conductivity-determining ions 142 of an impurity species, where the angle of bombardment is chosen such that the ions 142 can be implanted within a channel region 144 underlying the gate structure 102 and in the semiconductor material 106 outside the channel region 144 (i.e., outside of the area covered by the gate structure 102). Notably, the covered gate structure 102 and the patterned mask 140 cooperate to control and determine the extent to which the ions 142 are able to penetrate into the channel region 144. In other words, the semiconductor material 106 near and under the edge of the gate structure 102 is subjected to tilted ion implantation, while the ion implantation mask 140 inhibits ion implantation in the semiconductor material 106 near or at the covered gate structure 104.

It should be appreciated that one or more tilted ion implantation procedures may be performed to create tilted extension implants and/or tilted halo implants in the channel region 144, as is well understood. For PFET device structures, halo implants will be n-type, and extension implants will be p-type. For simplicity and ease of description, FIG. 4 generically depicts an ion implantation procedure that may represent a halo implant procedure, an extension implant procedure, or both. Tilted ion implantation is performed at this time because such implantation would be difficult if not impossible to perform after formation of stress-inducing material at the source and drain regions (described in more detail below). In certain embodiments, a similar ion implantation procedure is performed for the NFET device structures. After the ion implantation step(s), the semiconductor device structure 100d can be prepared for epitaxial material formation in accordance with the techniques presented in the following description.

Figure 5:
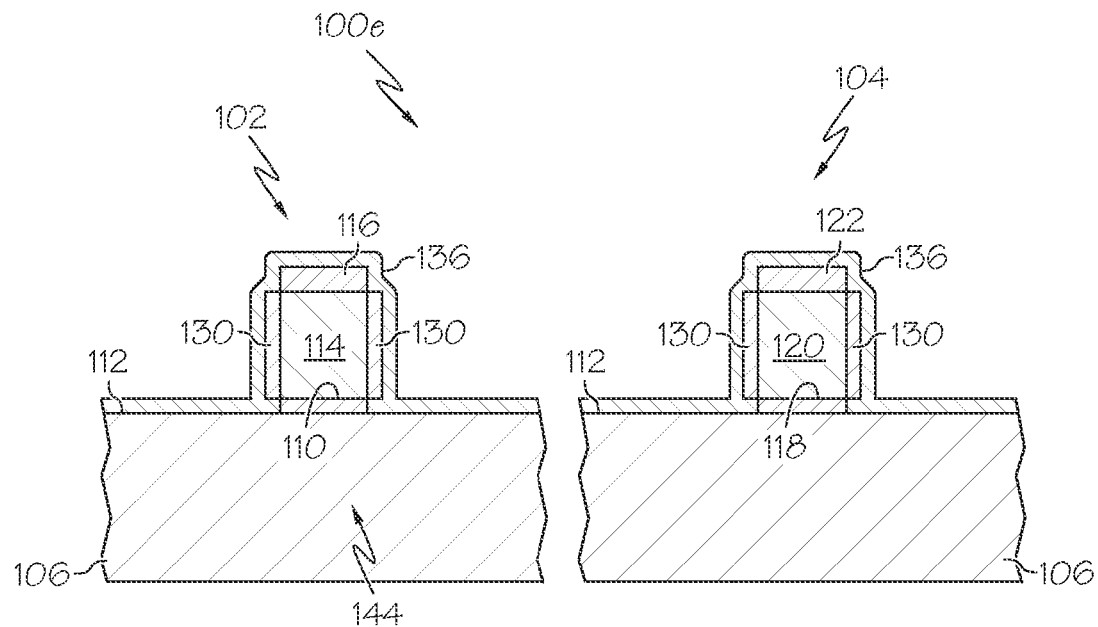

After implanting the channel region 144, the fabrication process continues by removing the ion implantation mask 140. FIG. 5 depicts the semiconductor device structure 100e after complete removal of the mask 140. In certain embodiments, the mask 140 is removed by a plasma strip process followed by a passivation clean process to remove any organic residuals that may remain from the material used to form the mask 140. Notably, the layer of oxide material 136 protects the underlying gate structures 102, 104 during these stripping and cleaning steps.

Figure 6:
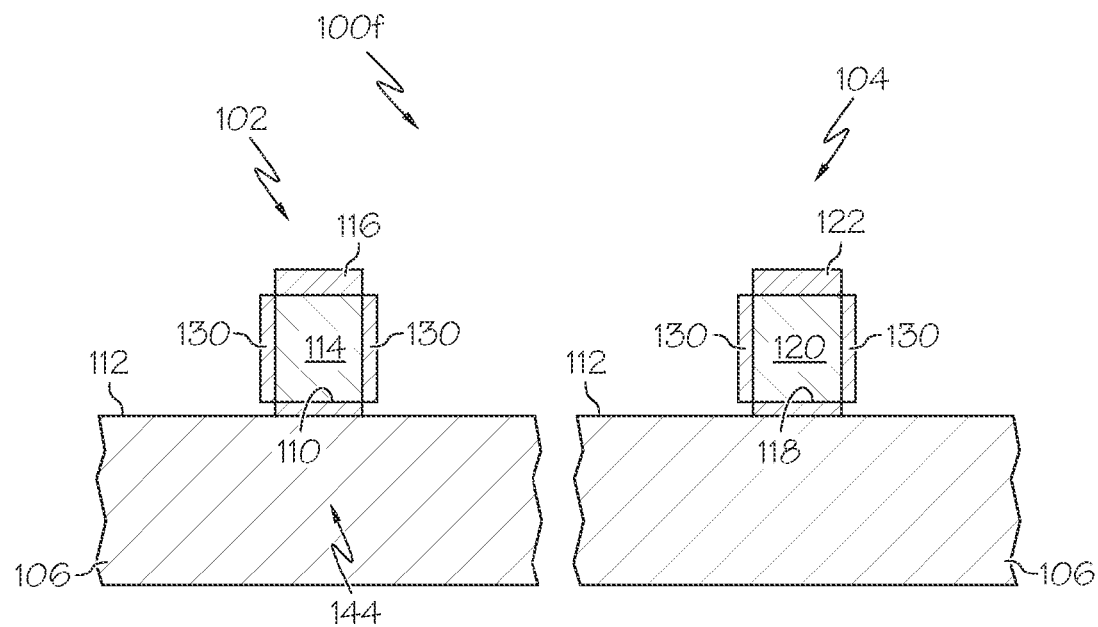

After removing the ion implantation mask 140 and cleaning the semiconductor device structure 100e, the process continues by removing the layer of oxide material 136. FIG. 6 shows the semiconductor device structure 100e after complete removal of the layer of oxide material 136. In certain embodiments, the layer of oxide material 136 is removed from the gate structures 102, 104 using an appropriate wet etching technology (e.g., a diluted hydrofluoric acid etchant) to expose the gate structures 102, 104 and to expose some of the upper surface 112 of the semiconductor material 106. In practice, the parameters of this wet etching step are carefully controlled to remove the layer of oxide material 136 without over-etching the oxide sidewalls 130 and without over-etching the gate insulators 110, 118, which may also be formed from an oxide material.

Figure 7:
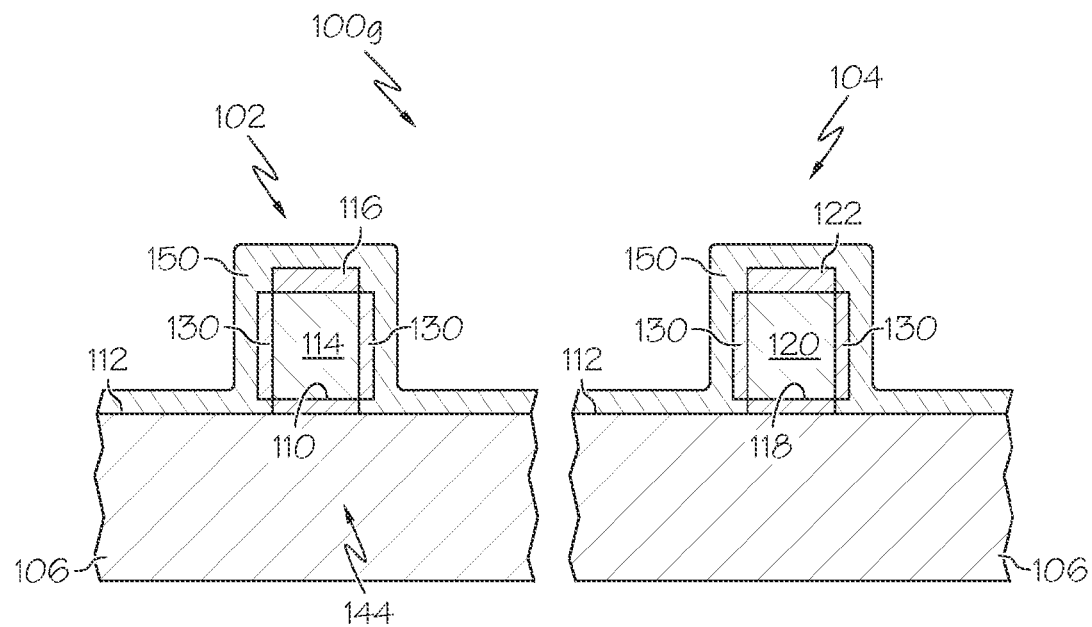

Next, a layer of dielectric material 150 is formed overlying the gate structures 102, 104 (see FIG. 7). In practice, the dielectric material can be conformally deposited overlying the gate structures 102, 104 and overlying the exposed upper surface 112 of the semiconductor material 106. For this particular embodiment, the dielectric material 150 is a silicon nitride material. The silicon nitride can be deposited in a known manner by, for example, ALD, CVD, LPCVD, semi-atmospheric chemical vapor deposition (SACVD), or PECVD. The layer of dielectric material 150 is deposited to a thickness so that, after anisotropic etching, spacers formed from the dielectric material 150 have a thickness that is appropriate for the subsequent etching steps described below. In typical implementations, the layer of dielectric material 150 is deposited to a thickness of about 5-50 nm.

Figure 8:
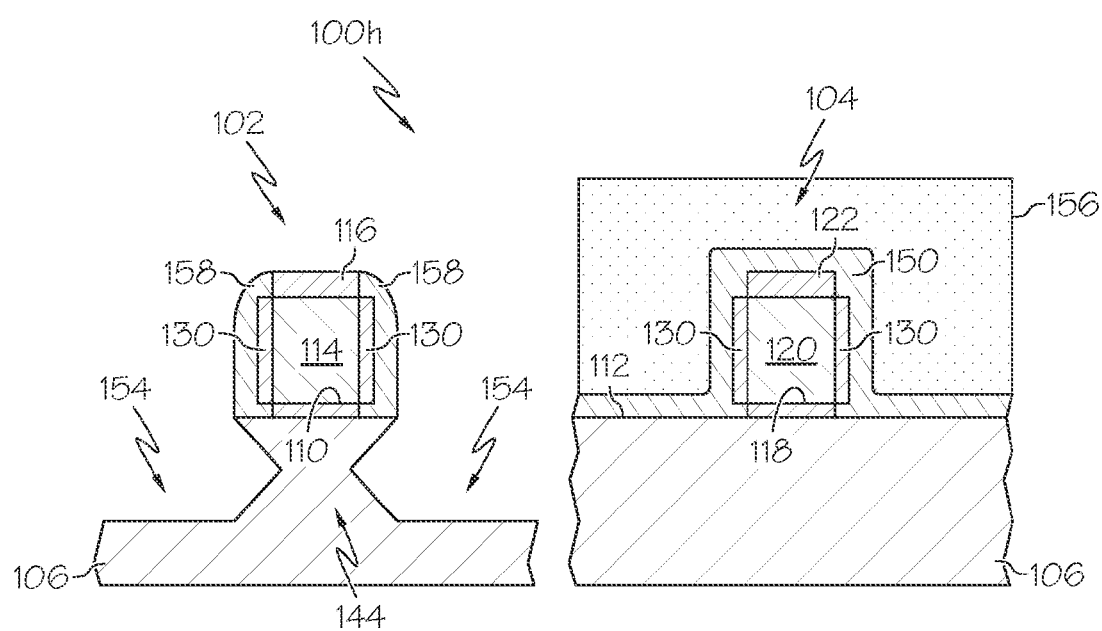

The process continues, in accordance with an exemplary embodiment, with the formation of source and drain cavities 154 in the semiconductor material 106. FIG. 8 depicts the semiconductor device structure 100h after the source and drain cavities 154 have been created. For this embodiment, the source and drain cavities 154 are formed only for the PFET device structures. The source and drain cavities 154 may be formed in accordance with conventional process techniques. In this regard, FIG. 8 depicts the semiconductor device structure 100h after various process steps have been performed. More specifically, the semiconductor device structure 100h is created by: forming a patterned etch mask 156 overlying the NFET device structures (e.g., the gate structure 104 and the section of the dielectric material 150 overlying the gate structure 104); etching the exposed dielectric material 150 to form spacers 158 adjacent sidewalls of the gate structure 102; and etching the semiconductor material 106 using the spacers 158 as a portion of an etch mask.

The dielectric material 150 can be etched by, for example, reactive ion etching (RIE) using a suitable etching chemistry. As shown, the formation of the spacers 158 also results in the etching of the dielectric material 150 overlying the nitride hard mask cap 116 of the gate structure 102. Accordingly, creation of the spacers 158 causes the nitride hard mask cap 116 to be exposed. After the spacers 158 have been formed, the source and drain cavities 154 can be etched. During this etching step the nitride hard mask cap 116, the spacers 158, and the etch mask 156 protect the other features and structures. The semiconductor material 106 can be etched using, for example, a crystallographical dependent silicon etchant such as TMAH. Although FIG. 8 depicts "sigma" shaped source and drain cavities 154, alternate embodiments may utilize other shapes if so desired.

Figure 9:
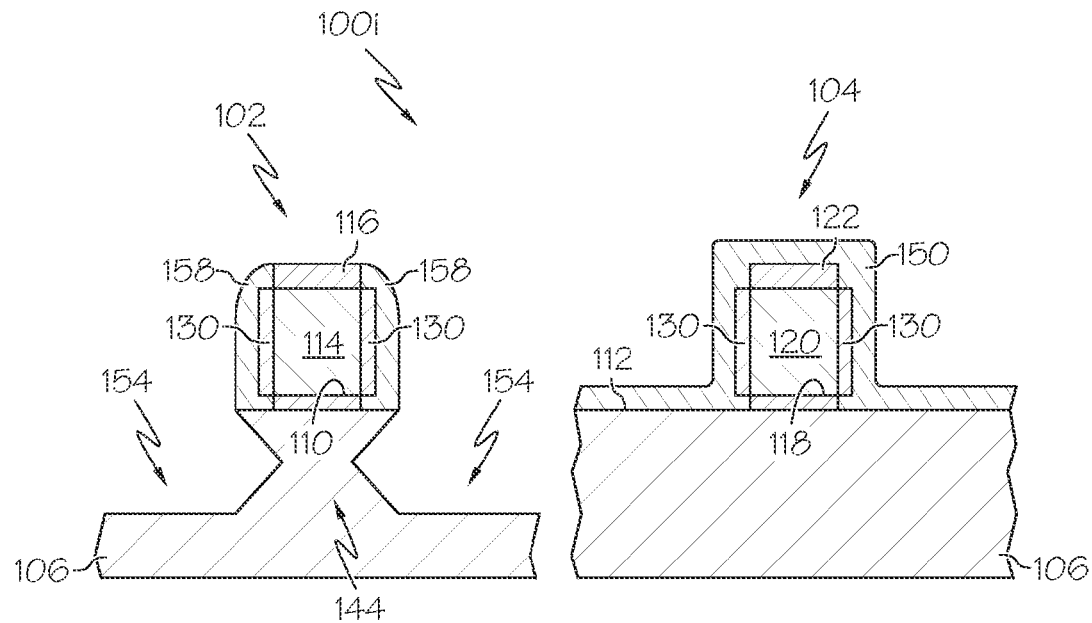
Figure 10:
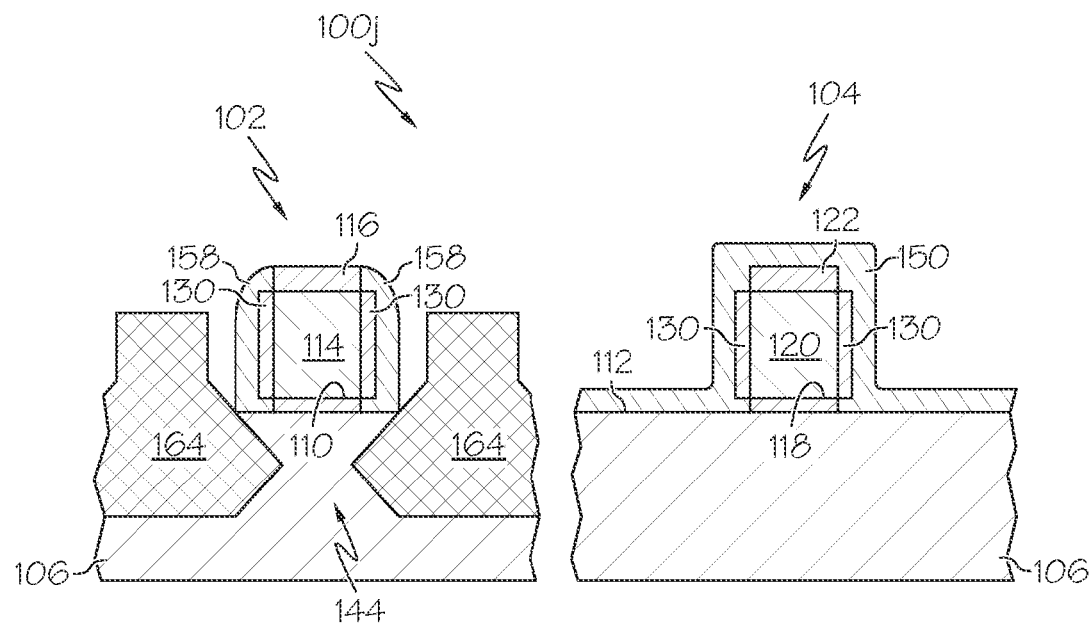

After the source and drain cavities 154 have been formed, the process continues by removing the etch mask 156 to expose the dielectric material 150. FIG. 9 depicts the semiconductor device structure 100$i$ after removal of the etch mask 156. The etch mask 156 is removed using any technique that is appropriate for the composition of the etch mask 156. For example, the etch mask 156 may be removed by a plasma strip technique (e.g., oxygen ambient ash) in accordance with conventional processing procedures. After removal of the etch mask 156, the process continues by forming regions of epitaxial semiconductor material 164 in the source and drain cavities 154. As is well understood, the resulting regions of epitaxial semiconductor material 164 correspond to source and drain regions that cooperate with the gate structure 102. FIG. 10 depicts the state of the semiconductor device structure 100$j$ after the source and drain cavities 154 have been filled with the epitaxial semiconductor material 164. For this particular embodiment, the regions of epitaxial semiconductor material 164 are formed as overfilled extended height regions that protrude above the upper surface 112 of the semiconductor material 106 (i.e., the surface on which the gate structure 102 resides). As mentioned previously, the extended height of the epitaxial semiconductor material 164 inhibits effective ion implantation underlying the gate structure 102. For this reason, the tilted ion implants are created in the channel region 144 earlier in the fabrication process (see FIG. 4).

The epitaxial semiconductor material 164 is a stress inducing material, which may be a doped silicon based material. In accordance with known techniques, the stress inducing material can be formed by epitaxially growing a silicon material in the source and drain cavities 154. Epitaxially grown in situ doped silicon material can be utilized here such that the material need not be subjected to ion implantation for purposes of doping. For a PFET device, the epitaxial semiconductor material may be a silicon germanium material, or some other material that has a greater lattice constant than silicon, such as a compound semiconductor, or the like. Notably, the layer of dielectric material 150 prevents growth of epitaxial material overlying the NFET device structure.

Figure 11:
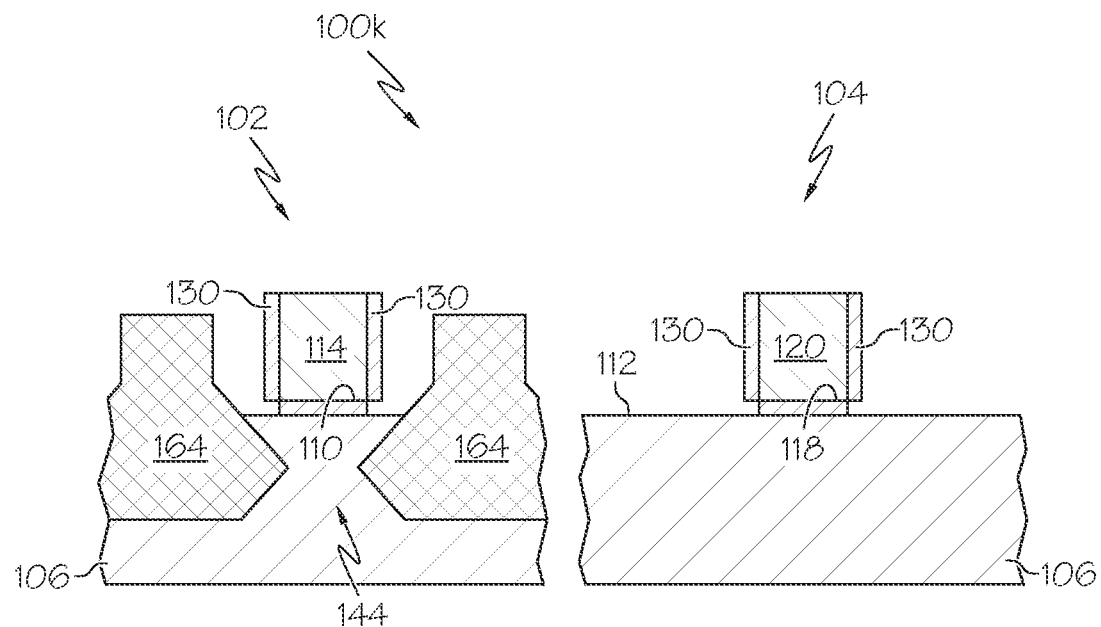

After the regions of epitaxial semiconductor material 164 have been formed, the process continues by removing silicon nitride material from the semiconductor device structure 100$j$. In this regard, FIG. 11 depicts the semiconductor device structure 100$k$ after removal of any and all exposed silicon nitride features and layers. More specifically, the spacers 158, the remaining portion of the dielectric material 150, and the nitride hard mask caps 116, 122 have all been removed. In certain embodiments, all of the silicon nitride features are removed concurrently and during a single (the same) etching step. Accordingly, the silicon nitride material can be etched away using a selective etch chemistry and a suitable etching technique that does not attack the semiconductor material 106, the oxide sidewalls 130, the polysilicon gate elements 114, 120, or the epitaxial semiconductor material 164. For example, the silicon nitride material can be removed using hot phosphoric acid, which is a common and standard etch technique for silicon nitride.

Thereafter, any number of known process steps can be performed to complete the fabrication of a PFET device that includes the gate structure 102, and to complete the fabrication of an NFET device that includes the gate structure 104. For example, the fabrication process may continue by forming additional ion implants, metal silicide contact areas, metal interconnect layers, interlayer dielectric material, conductive plugs, and the like. Notably, the lack of residual silicon nitride overlying the polysilicon gate elements 114, 120 makes it easy to implant ions into the polysilicon gate elements 114, 120, and facilitates the creation of silicide contact areas for the gate structures 102, 104.

Figure 12:
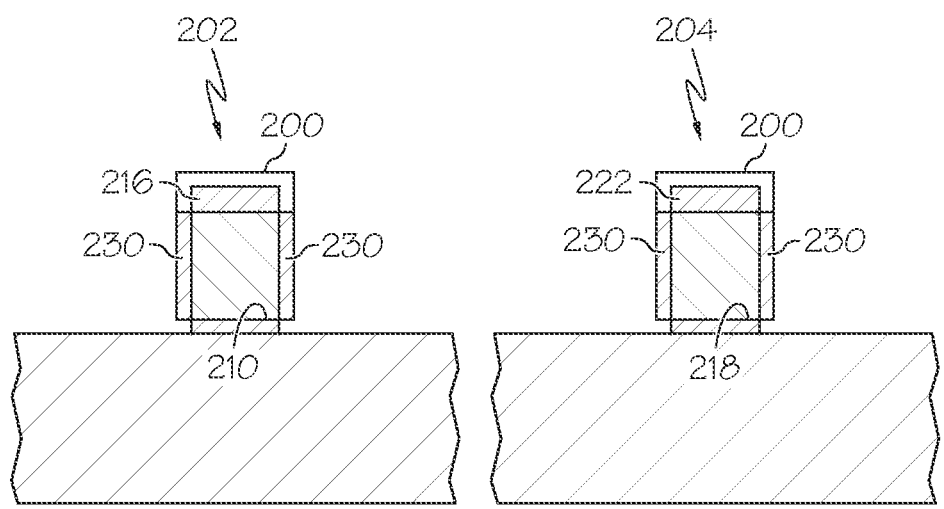
FIGS. 12-14 are cross sectional views that illustrate an alternate method of fabricating a semiconductor device structure.

Referring back to FIG. 3, the layer of oxide material 136 serves as a sacrificial layer that preferably eliminates any residual silicon nitride overlying the polysilicon gate elements 114. If the layer of oxide material 136 is absent, then the removal of the ion implantation mask 140 (refer to FIG. 4 and FIG. 5) results in the formation of a thin oxidized layer overlying the silicon nitride caps. This phenomena is depicted in FIG. 12, which shows a thin oxidized layer 200 overlying the silicon nitride caps 216, 222 of the gate structures 202, 204. Removal of this oxidized layer 200 by etching would result in the removal of the oxide sidewalls 230 and, in some cases, the partial removal of the gate insulators 210, 218 (both of these side effects are undesirable). Accordingly, the oxidized layer 200 remains intact at this stage of the process.

Figure 13:
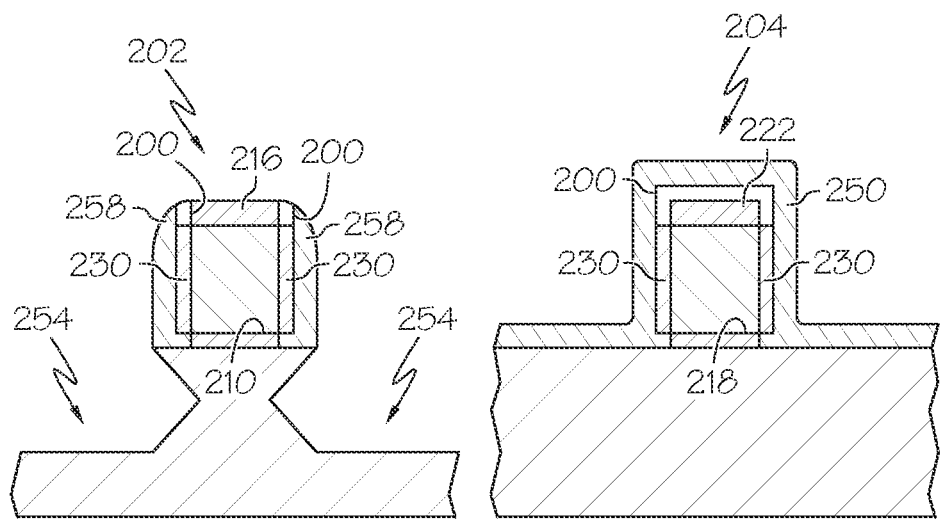

For this example, creation of the source and drain cavities 254 occurs while the oxidized layer 200 overlying the NFET gate structure 204 remains intact and protected under the layer of dielectric material 250, as depicted in FIG. 13. In contrast, most of the oxidized layer 200 overlying the PFET gate structure 202 is removed during the etching steps that create the silicon nitride spacers 258 and the source and drain cavities 254. As shown in FIG. 13, the upper surface of the silicon nitride cap 216 is exposed after etching of the source and drain cavities 254.

Figure 14:
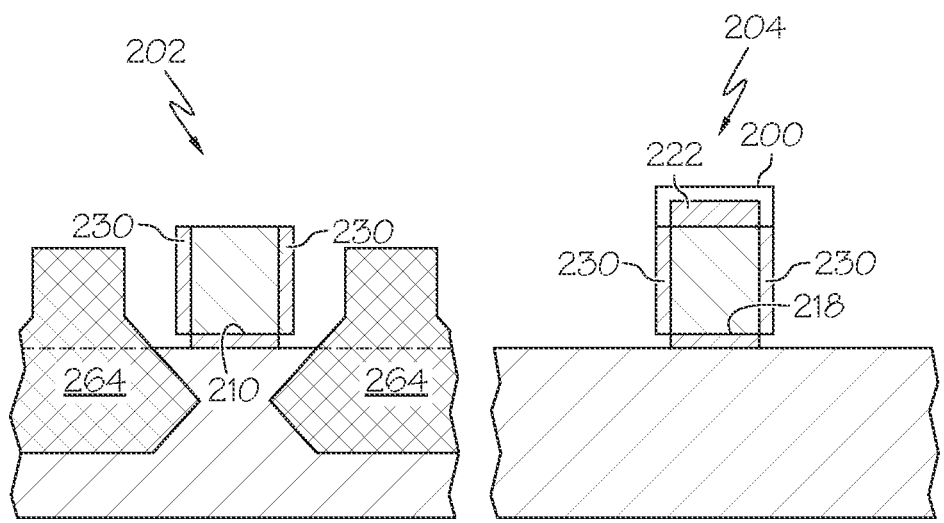

The oxidized layer 200 overlying the silicon nitride cap 222 of the NFET gate structure 204 serves as a protective barrier for the silicon nitride cap 222 during the nitride etch step(s) that follow the epitaxial growth of the stress inducing semiconductor material. In this regard, FIG. 14 shows the PFET gate structure 202 and the associated epitaxial semiconductor material 264 in the same arrangement and configuration shown in FIG. 11. The remaining portion of the oxidized layer 200 on the gate structure 202 is removed along with the silicon nitride (due to the lack of structural support surrounding the residual portion of the oxidized layer 200—see FIG. 13). In contrast to that shown in FIG. 11, however, the NFET gate structure 204 still includes the silicon nitride cap 222 under the oxidized layer 200. The presence of this residual silicon nitride cap 222 is undesirable for the reasons mentioned previously. The formation of the layer of oxide material 136 (see FIG. 3) facilitates complete removal of the nitride hard mask caps 116, 122 to avoid the problems associated with the presence of residual silicon nitride.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device structure, the method comprising:
   forming a first gate structure and a second gate structure overlying a semiconductor material, the first gate structure having a first silicon nitride cap overlying a first polysilicon gate element, and the second gate structure having a second silicon nitride cap overlying a second polysilicon gate element;
   forming a layer of oxide material overlying the first gate structure and the second gate structure, resulting in a first covered gate structure and a second covered gate structure;
   forming an ion implantation mask overlying the second covered gate structure, while the first covered gate structure remains exposed;
   subjecting the first covered gate structure to a tilted ion implantation procedure, while the ion implantation mask inhibits ion implantation at the second covered gate structure, resulting in an implanted device structure;
   after completing the tilted ion implantation procedure, removing the ion implantation mask, wherein the layer of oxide material protects the first gate structure and the second gate structure during removal of the ion implantation mask;
   after removing the ion implantation mask, completely removing the layer of oxide material to expose the first gate structure and the second gate structure;
   thereafter, preparing the implanted device structure for epitaxial material formation by forming a layer of silicon nitride material overlying the exposed first gate structure and the exposed second gate structure, and by creating sidewall spacers for the first gate structure, the sidewall spacers created by etching the layer of silicon nitride material; and
   thereafter, forming regions of epitaxial semiconductor material corresponding to source and drain regions for the first gate structure.

2. The method of claim 1, further comprising:
   forming oxide sidewalls on the first polysilicon gate element and on the second polysilicon gate element, wherein the layer of oxide material is formed overlying the oxide sidewalls.

3. The method of claim 1, wherein forming the layer of oxide material comprises:
   conformally depositing the layer of oxide material to a thickness less than ten nanometers overlying the first gate structure and the second gate structure.

4. The method of claim 1, wherein subjecting the first covered gate structure to the tilted ion implantation procedure comprises:
   creating tilted halo implants in a channel region of the semiconductor material.

5. The method of claim 1, wherein subjecting the first covered gate structure to the tilted ion implantation procedure comprises:
   creating tilted extension implants in a channel region of the semiconductor material.

6. The method of claim 1, further comprising:
   fabricating an n-type field effect transistor (NFET) that includes the second gate structure; and
   fabricating a p-type field effect transistor (PFET) that includes the first gate structure and the regions of epitaxial material.

7. The method of claim 1, further comprising:
   removing exposed silicon nitride material, including the first silicon nitride cap and the second silicon nitride cap.

8. The method of claim 1, wherein preparing the implanted device structure comprises:
   etching source and drain cavities in the semiconductor material, using the sidewall spacers as a portion of an etch mask, wherein the regions of epitaxial semiconductor material are formed in the source and drain cavities.

9. The method of claim 1, wherein forming the regions of epitaxial semiconductor material comprises:
   forming extended height regions of epitaxial semiconductor material that protrude above an upper surface of the semiconductor material.

10. A method of fabricating a semiconductor device structure, the method comprising:
   forming a layer of oxide material overlying a first gate structure comprising a first silicon nitride cap and overlying a second gate structure comprising a second silicon nitride cap, the first gate structure corresponding to a first-conductivity-type transistor to be fabricated, and the second gate structure corresponding to a second-conductivity-type transistor to be fabricated;
   performing a tilted ion implantation procedure to implant ions of an impurity species in a channel region of semiconductor material underlying the first gate structure, during which an ion implantation mask protects the second gate structure;
   after performing the tilted ion implantation procedure, removing the ion implantation mask, wherein the layer of oxide material protects the first gate structure and the second gate structure during removal of the ion implantation mask;
   after removing the ion implantation mask, completely removing the layer of oxide material to expose the first silicon nitride cap of the first gate structure and to expose the second silicon nitride cap of the second gate structure;
   after removing the ion implantation mask and the layer of oxide material, forming regions of epitaxial semiconductor material corresponding to source and drain regions for the first gate structure, wherein forming the regions of epitaxial semiconductor material comprises:
      forming a layer of silicon nitride material overlying the exposed first silicon nitride cap and overlying the exposed second silicon nitride cap;
      etching the layer of silicon nitride material to create sidewall spacers for the first gate structure; and
      etching cavities in the semiconductor material, using the sidewall spacers as a portion of an etch mask; and
      filling the cavities with the epitaxial semiconductor material; and
   after forming the regions of epitaxial semiconductor material, removing the first silicon nitride cap and the second silicon nitride cap.

11. The method of claim 10, wherein:
   the first-conductivity-type transistor is a p-type field effect transistor; and
   the second-conductivity-type transistor is an n-type field effect transistor.

12. The method of claim 10, wherein filling the cavities comprises:
overfilling the cavities with the epitaxial semiconductor material to a height that protrudes above an upper surface of the semiconductor material.

13. The method of claim 10, further comprising:
after filling the cavities with the epitaxial semiconductor material, removing the spacers and any remaining portion of the layer of silicon nitride material.

14. The method of claim 13, wherein removing the silicon nitride cap of the first gate structure, removing the silicon nitride cap of the second gate structure, removing the spacers, and removing the remaining portion of the layer of silicon nitride material are performed concurrently.

15. The method of claim 13, wherein removing the silicon nitride cap of the first gate structure, removing the silicon nitride cap of the second gate structure, removing the spacers, and removing the remaining portion of the layer of silicon nitride material are performed during a single etching step.

16. A method of processing a semiconductor device structure comprising a semiconductor material, a first gate structure overlying the semiconductor material, and a second gate structure overlying the semiconductor material, the first gate structure comprising a first silicon nitride cap, the second gate structure comprising a second silicon nitride cap, the first gate structure corresponding to a p-type field effect transistor (PFET) to be fabricated, and the second gate structure corresponding to an n-type field effect transistor (NFET) to be fabricated, the method comprising:
forming a layer of oxide material overlying the first gate structure and the second gate structure;
after forming the layer of oxide material, performing a tilted ion implantation procedure to implant ions of an impurity species in the semiconductor material underlying the first gate structure, wherein an ion implantation mask covers the second gate structure during the tilted ion implantation procedure;
after performing the tilted ion implantation procedure, removing the ion implantation mask, wherein the layer of oxide material protects the first gate structure, including the first silicon nitride cap, and protects the second gate structure, including the second silicon nitride cap, during removal of the ion implantation mask;
after removing the ion implantation mask, completely removing the layer of oxide material to expose the first silicon nitride cap of the first gate structure and to expose the second silicon nitride cap of the second gate structure;
after removing the ion implantation mask and the layer of oxide material, forming a layer of silicon nitride material overlying the first gate structure and the second gate structure;
creating spacers adjacent sidewalls of the first gate structure, the spacers created from the layer of silicon nitride material;
etching source and drain cavities in the semiconductor material, using the spacers as a portion of an etch mask; and
forming regions of epitaxial semiconductor material in the source and drain cavities, the regions of epitaxial semiconductor material extending above an upper surface of the semiconductor material.

17. The method of claim 16, further comprising:
after forming the regions of epitaxial semiconductor material, removing the first silicon nitride cap and the second silicon nitride cap.

18. The method of claim 17, further comprising:
after forming the regions of epitaxial semiconductor material, removing the spacers and any remaining portion of the layer of silicon nitride material.

19. The method of claim 18, wherein removing the first silicon nitride cap, removing the second silicon nitride cap, removing the spacers, and removing the remaining portion of the layer of silicon nitride material are concurrently performed during a single etching step.

* * * * *